United States Patent [19]

Hiroi

[11] Patent Number: 6,005,762
[45] Date of Patent: Dec. 21, 1999

[54] COOLING SYSTEM OF A SEMICONDUCTOR TESTING DEVICE USING A CONTROL COMPUTER

[75] Inventor: Hajime Hiroi, Tokyo, Japan

[73] Assignee: Ando Electric Co., Ltd., Tokyo, Japan

[21] Appl. No.: 09/094,912

[22] Filed: Jun. 12, 1998

[30] Foreign Application Priority Data

Jun. 30, 1997 [JP] Japan .................................. 9-190408

[51] Int. Cl.⁶ .................................................. H02H 5/00
[52] U.S. Cl. ........................................... 361/103; 361/115
[58] Field of Search .............................. 361/23, 25, 103, 361/115

[56] References Cited

U.S. PATENT DOCUMENTS 5,075,606 12/1991 Lipman .................................... 318/254

Primary Examiner—Stephen W. Jackson
Attorney, Agent, or Firm—Flynn, Thiel, Boutell & Tanis, P.C.

[57] ABSTRACT

There is provided a cooling system of a semiconductor testing device using a control computer capable of controlling the number of revolutions of a fan so as to obtain proper air-flow corresponding to the heating value for every operating mode of a measuring unit, thereby preventing the power from being wasted and enabling the supervision of the operating modes of the entire system. The cooling system includes a fan which is rotated by a DC motor, a temperature sensor for measuring a temperature of a measuring unit which is cooled by the fan, a control computer for reading temperature information and revolution information. The control computer transmits a control signal for controlling the number of revolutions of the fan to a fan control·power supply unit for executing optimum control of the number of revolutions of the fan corresponding to heating value for every operating mode of the measuring unit.

7 Claims, 4 Drawing Sheets

COOLING SYSTEM OF A SEMICONDUCTOR TESTING DEVICE USING A CONTROL COMPUTER

BACKGROUND OF THE INVENTION

1. Field of the Invention

The present invention relates to a cooling system of a semiconductor testing device using a control computer, particularly to a cooling system of a semiconductor testing device using a control computer for controlling the number of revolutions of a fan so as to obtain air-flow corresponding to a heating value of a measuring unit by use of the fan which is driven by a DC motor, thereby preventing a power from being wasted wherein the system uses a control computer which is capable of supervising operating modes of the entire semiconductor testing device.

2. Prior art

A semiconductor testing device generally comprises a body 200 and test heads 300 as shown in FIG. 3(A), wherein electric characteristics of a device to be measured mounted on the test heads 300 is tested by the body 200, namely, by the control carried out by the body 200.

In such a semiconductor testing device, there has been employed a system shown in FIG. 4 for cooling a measuring unit 100A which is mounted in the body 200 or in the test heads 300.

That is, in FIG. 4, a fan 80A is provided adjacently to the measuring unit 100A, wherein a three-phase AC motor 82A of the fan 80A is revolved or rotated to suck air heated by heat produced by the measuring unit 100A.

At this time, since there produces a negative pressure at the part where air is sucked, outside cool air is taken in this part through an open portion of the measuring unit 100A provided at the opposing position of the fan 80A.

As a result, the measuring unit 100A dissipates or radiates heat so that the measuring unit 100A is cooled.

In this case, the number of revolutions of the three-phase AC motor 82A for driving the fan 80A is determined by a frequency of the AC power supply of the motor and the number of poles of a revolving field of the motor. From this, the number of revolutions of the three-phase AC motor 82A has generally a specific fixed value.

That is, the following well known relationship or expression is established in the three-phase AC motor 82A suppose that the number of revolutions is Nac (unit: rps), the frequency of AC power supply is F (unit: Hz), and the number of poles of the revolving field is p.

$$Nac = 2F/p \quad (1)$$

In the expression (1), the frequency F of the AC power supply is generally 50 Hz or 60 Hz, and the number of poles p of the revolving field is a fixed value which is determined when manufacturing a motor.

Accordingly, the number of revolutions Nac of the three-phase AC motor 82A becomes a fixed value as evident from the expression (1).

The air-flow needed for cooling the measuring unit 100A is determined by the number of revolutions Nac of the three-phase AC motor 82A and a sectional area of the fan 80A.

Further, in FIG. 4, a temperature sensor 70A is generally a thermal relay type which operates when the temperature exceeds a specific temperature (anomalous temperature region), and the operating modes of the relay (ON/OFF) are transmitted to a power supply controller 90 via a signal cable 71A.

Accordingly, the power supply controller 90 cuts off a power supplied to the measuring unit 100A via a power supply cable 101A. That is, the measuring unit 100A has been conventionally cooled by the fan 80A employing the three-phase AC motor 82A, and the power supply has been cut off when an ambient temperature of the measuring unit 100A reaches an anomalous temperature region.

In the prior art as mentioned above in FIG. 4, the air-flow needed for cooling the measuring unit 100A is determined by the number of revolutions Nac of the three-phase AC motor 82A and the sectional area of the fan 80A.

However, as evident from the expression (1), since the number of revolutions Nac of the three-phase AC motor 82A is a fixed value and the sectional area of the fan 80A is constant, the air-flow needed for cooling the measuring unit 100A is invariant regardless of whether the measuring unit 100A is in standby condition (heating value Qa is small) or in operating condition (heating value Qa is large) when the three-phase AC motor 82A is used.

For example, suppose that the semiconductor detecting device shown in FIG. 3(A) has measuring units U1, U2, U3 and there are operating modes shown in FIG. 3(B) wherein standby condition is denoted by X and the operation condition denoted by ○.

Of these operating modes, all the measuring units U1 to U3 are in operating condition in the case of a, and the measuring units U2 and U3 are in operating condition while the other measuring unit U1 is standby condition in the case of b, and one measuring unit U1 is in operating condition while the other measuring units U2 and U3 are in standby condition in the case of c, and all the measuring units U1 to U3 are in standby condition in the case of d.

Accordingly, in the case of FIG. 3(B), the heating value Qa is the largest in the case of a and it decreases in the order of b and c, and it is the smallest in the case of d. That is, there occurs a case where the power to be consumed by, i.e., the heating value of the measuring units is varied according to the operating condition or standby condition depending on devices to be measured in the semiconductor testing device (FIG. 3(A)).

However, air-flow needed for cooling the measuring unit can not be changed corresponding to the heating value Qa because the fan 80A which is driven by the three-phase AC motor 82A has been used.

Accordingly, even if the measuring unit 100A is in standby condition, there is needed air-flow presented which is the same as that for cooling the measuring unit 100A in a state of the maximum heating value. For example, even in the state of d in FIG. 3(B) (all the measuring units are in standby condition), there requires air-flow needed for cooling in the case of a (all the measuring units are in operating condition).

Accordingly, even in standby condition, i.e., in the case of d, the number of revolutions of the fan 80A increases by the air-flow needed for cooling the measuring unit 100A in the case of a, thereby power is consumed more than it is needed, and hence power is wasted.

Further, since the prior art cooling system of a semiconductor testing device shown in FIG. 4 has no function to supervise the operating condition of the entire device, it can not easily verify the operating modes when a malfunction occurs.

For example, there occurs a case where the power supply controller 90 erroneously stops the supply of power to the measuring unit 100A when it decides that the measuring unit 100A reaches the anomalous temperature region although the measuring unit 100A is in the range of normal temperatures.

SUMMARY OF THE INVENTION

It is an object of the present invention to provide a cooling system of a semiconductor testing device for controlling the number of revolutions of a fan so as to obtain proper air-flow corresponding to the heating value for every operating mode of a measuring unit so as to prevent the power used by the fan from being wasted, wherein the system uses a control computer which is capable of supervising operating modes of the entire semiconductor testing device.

To achieve this object, a cooling system of a semiconductor testing device for cooling a measuring unit 60A of the present invention comprises a fan 40A for cooling the measuring unit 60A by the rotation of a DC motor 42A, a temperature sensor 30A for measuring a temperature of the measuring unit 60A which is cooled by the fan 40A, a control computer 10 connected to the temperature sensor 30A via a temperature supervisory circuit 20 and to the fan 40A via a fan control·power supply unit 50 for reading temperature information T of the measuring unit 60A and revolution information R of the fan 40A and for outputting a control signal S for controlling the number of revolutions Ndc of the fan 40A, and the fan control power supply unit 50 for executing optimum control of the number of revolutions Ndc of the fan 40A corresponding to heating value Qa for every operating mode of the measuring unit 60A in response to the control signal S supplied from the control computer 10.

Accordingly, with the arrangement of the present invention, since the fan 40A is driven by the DC motor 42A, for example, when a voltage V of the DC motor 42A is controlled (expression (1)), the number of revolutions Ndc of the fan 40A can be controlled so as to obtain proper air-flow corresponding the heating value Qa for every operating mode of the measuring unit 60A (FIG. 1), thereby preventing power used by the fan 40A from being wasted.

Further, there is provided the control computer 10 for reading the temperature information T such as the temperature and the like of the measuring unit 60A and revolution information R such as the voltage and the like which determines the number of revolutions Ndc of the fan 40A, the operating modes of the entire system can be supervised so that malfunction or erroneous operation, etc. can be easily verified, and hence more proper cooling control can be performed.

BEST MODE FOR CARRYING OUT THE INVENTION

Described hereinafter are the first and second embodiments of the present invention.
First Embodiment (FIG. 1)

Figure 1:
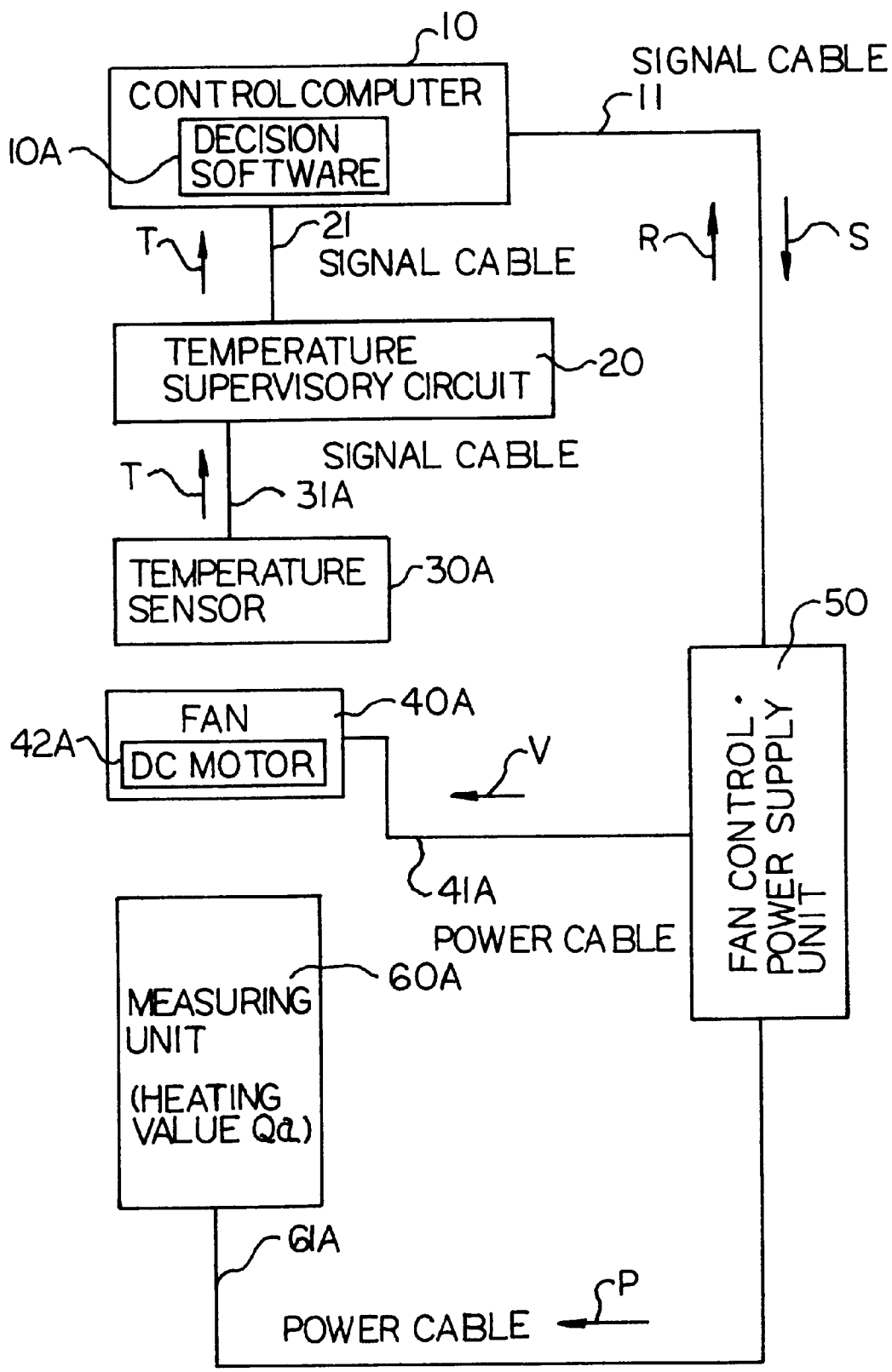
FIG. 1 is a view showing a cooling system of a semiconductor testing device using a control computer according to a first embodiment of the present invention.

In FIG. 1, showing a cooling system of a semiconductor testing device using a control computer according to a first embodiment of the present invention, denoted by 10 is a control computer, 20 is a temperature supervisory circuit, 30A is a temperature sensor, 40A is a fan, 50 is a fan control·power supply unit, and 60A is a measuring unit.

Figures 3A, 3B:
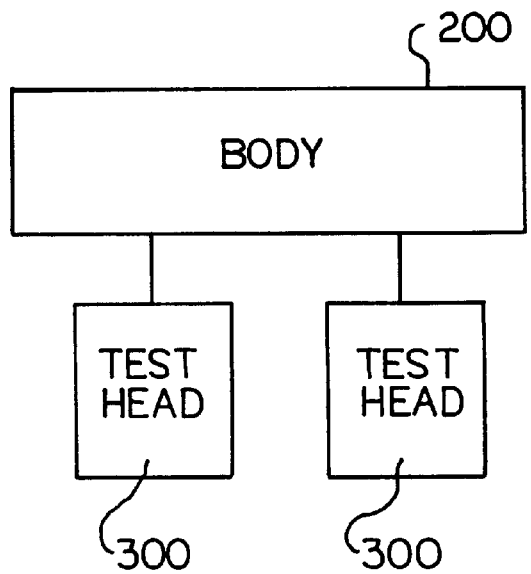
FIGS. 3(A) and 3(B) are views for generally explaining a semiconductor testing device.
Figure 4:
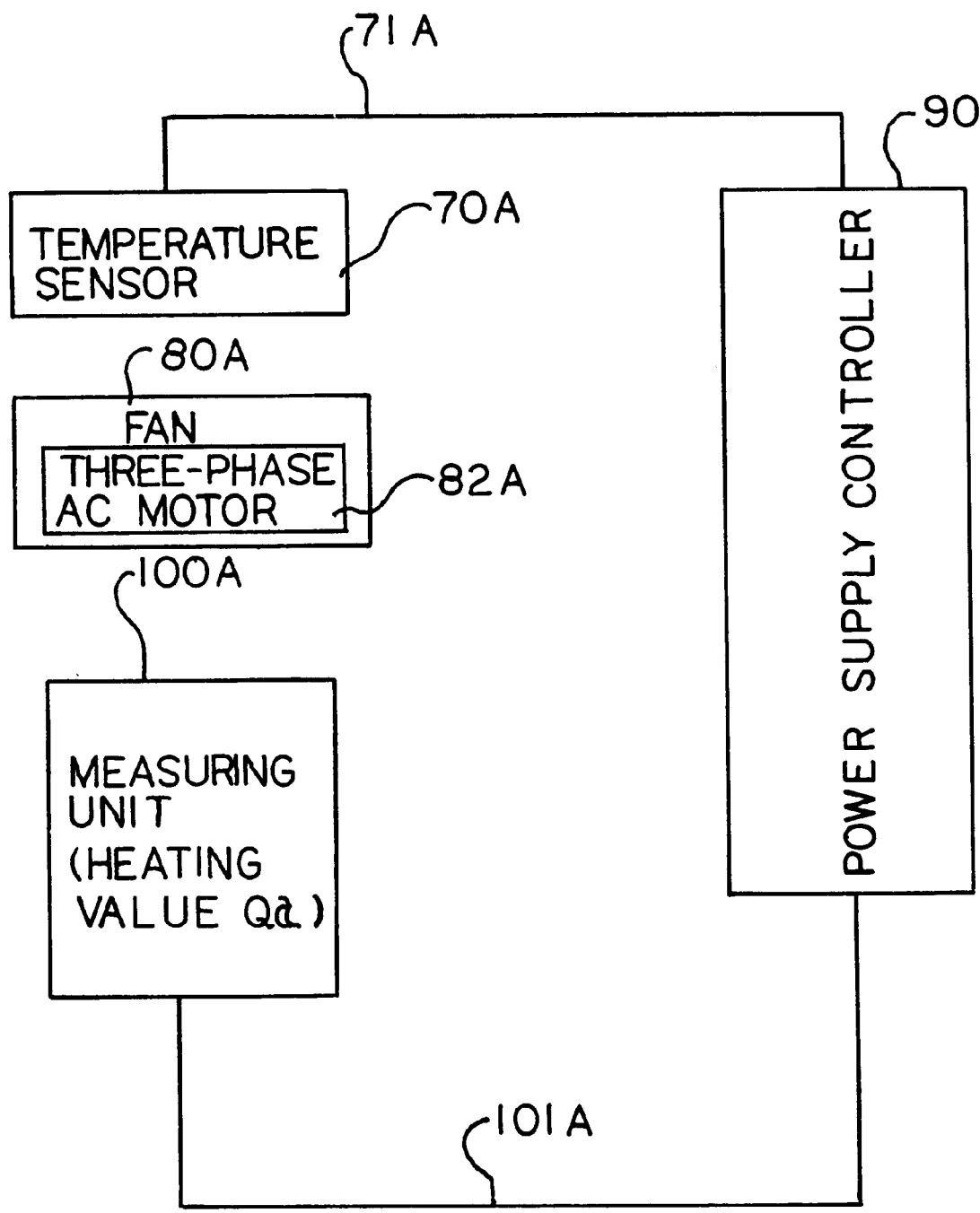
FIG. 4 is a view showing a prior art cooling system of a semiconductor testing device.

The measuring unit 60A is mounted in the body 200 or in the test heads 300 of the semiconductor testing device (FIG. 3(A)), and it produces heat upon receipt of power and it needs to be cooled.

The temperature sensor 30A measures an ambient temperature of the measuring unit 60A, and transmits temperature information T of the measuring unit 60A to a temperature supervisory circuit 20 via a signal cable 31A.

The fan 40A is disposed adjacently to the measuring unit 60A for sucking air, which is heated by the heat produced by the measuring unit 60A when a DC motor 42A thereof is rotated, so as to cool the measuring unit 60A by cool air from the outside.

The number of revolutions of the DC motor 42A for driving the fan 40A is represented by the following expression.

$$Ndc = K(V-rI)/\phi \qquad (2)$$

where in the DC motor 42A, the number of revolutions is Ndc (unit: rps), a voltage of the DC power supply of the motor is V (unit: V), a resistor of an armature circuit of the motor is r (unit: Ω), a current of the armature of the motor is I (unit: A), the number of magnetic flux of each pole is $\phi$ (unit: Wb) and a constant which is determined by the structure of the motor is K.

In the expression (2), there are methods of controlling the number of revolutions Ndc such as a method of changing the voltage V of the DC power supply, a method of changing the resistor r of the armature circuit and a method of changing the number of magnetic flux $\phi$ of each pole.

Of these methods, there has been generally employed the method of controlling or changing the voltage V of the DC power supply. Accordingly, in the first embodiment, the fan 40A employing the DC motor 42A is connected to the fan control·power supply unit 50 via a power cable 41A so as to control the voltage V, thereby controlling the number of the revolutions of the fan 40A.

The control computer 10 is connected to the temperature sensor 30A via the temperature supervisory circuit 20 and to the fan 40A via the fan control·power supply unit 50, respectively (FIG. 1).

With such an arrangement, the control computer 10 reads the temperature information T of the measuring unit 60A and the revolution information R of the fan 40A, and outputs a control signal S for controlling the number of revolutions Ndc of the fan 40A.

The temperature information T includes the temperature of the measuring unit 60A and information whether the temperature of the measuring unit 60A reaches an anomalous temperature region or not, whereas the revolution information R includes the set value of the voltage V determining the number of revolutions Ndc of the fan 40A (expression (2)) and the like.

Further, the control signal S includes a set value of the voltage V at which the number of revolutions Ndc of the fan 40A is optimized, an instruction to stop the supply of a power P when the temperature of the measuring unit 60A reaches the anomalous temperature region and a set value of the voltage V at which the fan 40A is rotated at its maximum number of revolutions, and the like.

The control computer 10 includes, for example, a decision software 10A, and operates in a manner as described hereinafter.

In the case where the temperature control computer 10 decides that the temperature of the measuring unit 60A does not reach the anomalous temperature region, the control computer 10 sets a voltage V so as to obtain the number of revolutions Ndc needed for cooling the measuring unit 60A corresponding to the heating value Qa thereof, and transmits the set value to the fan control-power supply unit 50 of the next stage as the control signal S.

In the case where the temperature control computer 10 decides that the temperature of the measuring unit 60A reaches the anomalous temperature region, the control computer 10 transmits the instruction to stop the supply of the power P to the measuring unit 60A and a set value of the voltage V needed for rotating the fan 40A at the maximum number of revolutions to the fan control-power supply unit (also represented as control/power supply unit) of the next stage, respectively as the control signal S.

Connected to the fan control-power supply unit 50 are the control computer 10 via the signal cable 11, the fan 40A via the power cable 41A and the measuring unit 60A via a power cable 61A.

With such an arrangement, the fan control-power supply unit 50 executes the optimum control of the number of revolutions Ndc of the fan 40A according to the heating value Qa for every operating mode of the measuring unit 60A in response to the control signal S based on the control of the decision software 10A of the control computer 10, as mentioned above.

Further, the fan control-power supply unit 50 supplies the power P to the measuring unit 60A, and stops the supply of the power P to the measuring unit 60A when the temperature of the measuring unit 60A reaches an anomalous temperature region at which the measuring unit 60A can not be cooled by the fan 40A, and rotates the fan 40A at the maximum number of revolutions to cool the measuring unit 60A based on the control of the decision software 10A of the control computer 10.

Figure 2:
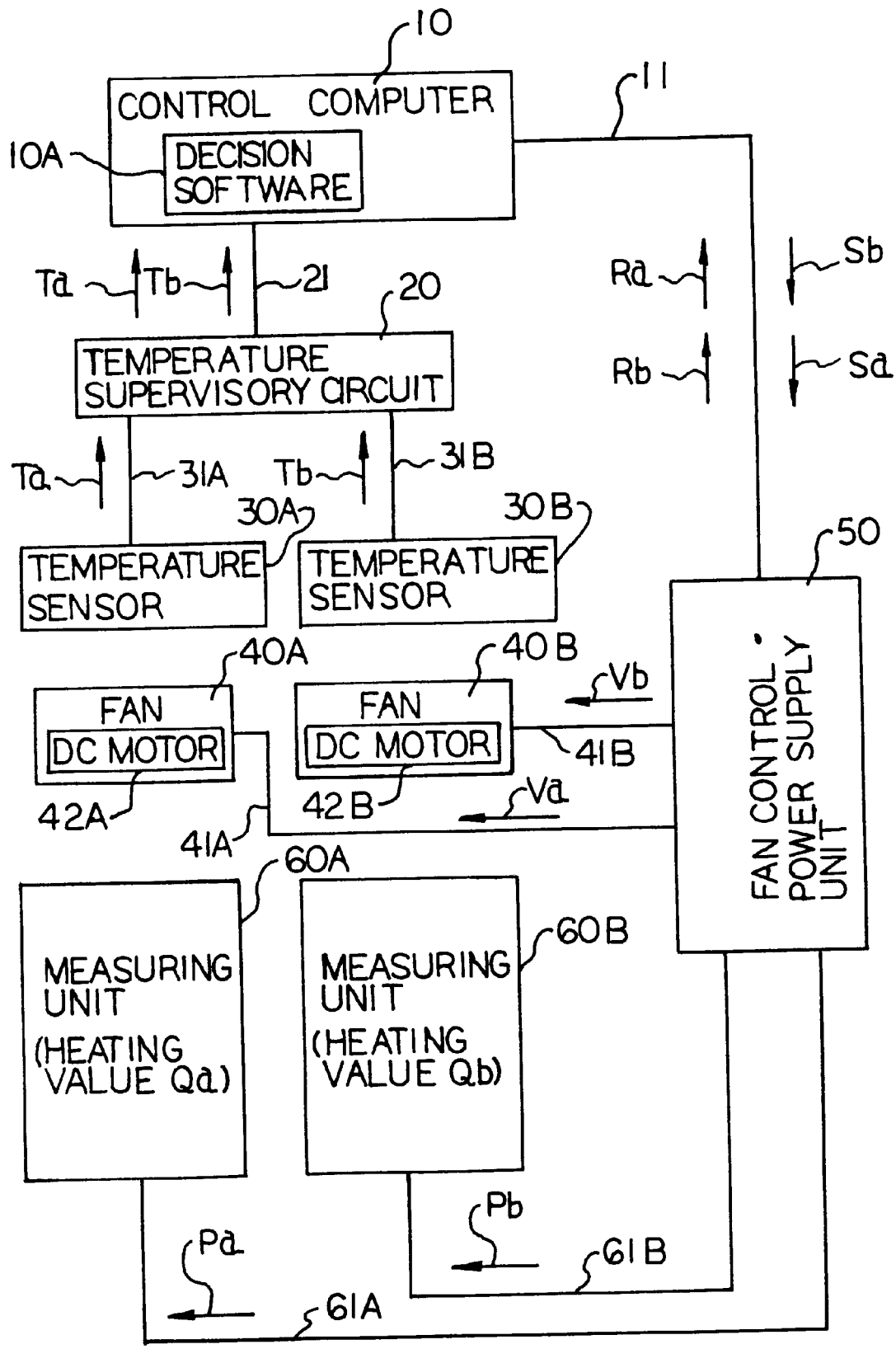
FIG. 2 is a view showing a cooling system of a semiconductor testing device using a control computer according to a second embodiment of the present invention.

Second Embodiment (FIG. 2)

FIG. 2 shows a second embodiment of the present invention, wherein there are provided two measuring units.

That is, there is provided another measuring unit 60B having the same arrangement as the measuring unit 60A in FIG. 1, a temperature sensor 30B for measuring the temperature of the measuring unit 60B, and a fan 40B for cooling the measuring unit 60B when a DC motor 42B is rotated.

Connected to the common fan control-power supply unit 50 are the measuring unit 60B via a power cable 61B and the fan 40B via a power cable 41B. Further, the temperature sensor 30B is connected to the temperature supervisory circuit 20 via a signal cable 31B.

In the second embodiment, the common fan control-power supply unit 50 and the temperature supervisory circuit 20 are employed, but two fan control-power supply units 50 and two temperature supervisory circuits 20 may be separately provided corresponding to the measuring unit 60A and the measuring unit 60B. Although there are provided two measuring units in FIG. 2, the number of measuring unit is not limited to two, but it may be provided not less than three.

The operation of the cooling system of the semiconductor testing device using the control computer and having the arrangement set forth above will be described now.

1. In the Case of a Single Measuring Unit

In the case of single measuring unit as shown in FIG. 1, air which is heated by the heat produced by the measuring unit 60A is sucked by the fan 40A which is driven by the DC motor 42A to cool the measuring unit 60A.

At this time, the present temperature of the measuring unit 60A is measured by the temperature sensor 30A, and the temperature information T issued by the temperature sensor 30A is transmitted to the temperature supervisory circuit 20 via the signal cable 31A, and the temperature supervisory circuit 20 transmits the temperature information T to the control computer 10 of the next stage via the signal cable 21. The control computer 10 always supervises the temperature information T transmitted from the temperature supervisory circuit 20.

In the case that the control computer 10 decides that the temperature of the measuring unit 60A does not reach an anomalous temperature region based on the decision software 10A, it sets a voltage V so as to obtain the number of revolutions Ndc needed for cooling the measuring unit 60A corresponding to heating value Qa, and transmits the set value as the control signal S to the fan control-power supply unit 50 via the signal cable 11.

That is, since the heating value Qa is small when the measuring unit 60A is in standby condition, the number of revolutions Ndc of the fan 40A may be small (expression (2)), thereby decreasing the set value of the voltage V.

However, since the heating value Qa is large when the measuring unit 60A is in operating condition, the number of revolutions Ndc of the fan 40A has to be large (expression (2)), thereby increasing the set value of the voltage V.

The fan control-power supply unit 50 produces a voltage V corresponding to the voltage value of that voltage upon receipt of the control signal S and applies it to the fan 40A so that the fan 40A rotates at the number of revolutions Ndc corresponding to this voltage V.

Further, if the temperature of the measuring unit 60A does not reach the anomalous temperature region, a given power P is supplied from the fan control-power supply unit 50 to the measuring unit 60A via the power cable 61A.

On the contrary, if the control computer 10 decides that the temperature of the measuring unit 60A reaches the anomalous temperature region at which the measuring unit 60A is not cooled by the fan 40A based on the decision software 10A, namely, reaches the anomalous temperature region, the control computer 10 transmits an instruction to stop the supply of power to the measuring unit 60A and the set value of the voltage needed for rotating the fan 40A at the maximum number of revolutions to the fan control-power supply unit 50 as the control signal S via the signal cable 11.

As a result, the fan control-power supply unit 50 stops the supply of the power to the measuring unit 60A and applies the voltage V needed for rotating the fan 40A at the maximum number of revolutions to the fan 40A via the power cable 41A so that the fan 40A rotates at the maximum number of revolutions.

When the heating value Qa varies while the measuring unit 60A is in standby condition where the heating value Qa is small and in operating condition where the heating value Qa is large, the operations are repeated in the aforementioned order to execute the optimum control of the number of revolutions Ndc of the fan 40A so as to obtain air-flow needed for cooling the measuring unit 60A corresponding to the heating value. Further, during this period, the control computer 10 can supervise the operating modes of the entire system by reading the temperature information T and the revolution information R.

2. In the Case of Two Measuring Units

In the case of two measuring units as shown in FIG. 2, the measuring unit 60A, the fan 40A, the temperature sensor 30A, the temperature supervisory circuit 20, the control computer 10 and the fan control-power supply unit 50 operate in the same manner as the previous case, namely, the case of single measuring unit.

However, regarding the measuring unit 60B, air heated by heat produced by the measuring unit 60B is sucked by the fan 40B which is driven by the DC motor 42B to cool the measuring unit 60B. At this time, the temperature sensor 30B measures the present temperature of the measuring unit 60B and issues temperature information Th which is transmitted to the temperature supervisory circuit 20B via the signal cable 31B, and the temperature supervisory circuit 20 transmits the temperature information Tb to the control computer 10 of the next stage via the signal cable 21. The control computer 10 always supervises the temperature information Th transmitted from the temperature supervisory circuit 20.

In the case that the control computer 10 decides that the temperature of the measuring unit 60B does not reach the anomalous temperature region based on the decision software 10A thereof, it sets a voltage Vb so as to obtain the number of revolutions Ndc needed for cooling the measuring unit 60B corresponding to heating value Qb, and transmits the set value to the fan control-power supply unit 50 via the signal cable 11 as a control signal Sb.

That is, since the heating value Qb is small when the measuring unit 60B is in standby condition, the number of revolutions Ndc of the fan 40B may be small (expression (2)), thereby decreasing the set value of the voltage Vb.

However, since the heating value Qb is large when the measuring unit 60B is in operating condition, the number of revolutions Ndc of the fan 40B has to be large (expression (2)), thereby increasing the set value of the voltage Vb.

The fan control-power supply unit 50 produces a voltage Vb corresponding to the voltage value of that voltage upon receipt of the control signal Sb and applies it to the fan 40B so that the fan 40B rotates at the number of revolutions Ndc corresponding to this voltage Vb (expression (2)).

Further, if the temperature of the measuring unit 60B does not reach the anomalous temperature region, a given power Pb is supplied from the fan control-power supply unit 50 to the measuring unit 60B via the power cable 61B.

On the contrary, if the control computer 10 decides that the temperature of the measuring unit 60B reaches the anomalous temperature region based on the decision software 10A, it transmits an instruction to stop the supply of power to the measuring unit 60B and the set value of a voltage needed for rotating the fan 40B at the maximum number of revolutions to the fan control-power supply unit 50 as the control signal Sb via the signal cable 11.

As a result, the fan control-power supply unit 50 stops the supply of the power to the measuring unit 60B and applies the voltage Vb needed for rotating the fan 40B at the maximum number of revolutions to the fan 40B via the power cable 41B so that the fan 40B rotates at the maximum number of revolutions.

When the heating value Qb varies while the measuring unit 60B is in standby condition where the heating value Qb is small and in operating condition where the heating value Qb is large, the operations are repeated in the aforementioned order to execute the optimum control of the number of revolutions Ndc of the fan 40B so as to obtain air-flow needed for cooling the measuring unit 60B corresponding to the heating value. During this period, the control computer 10 can supervise the operating modes of the entire system by reading the temperature information Ta and Tb and the revolution information Ra and Rb of the two measuring units 60A and 60B (FIG. 2).

Meanwhile, even if there are provided not less than three measuring units, there is performed the same operation as in the case there are provided not less than two measuring units.

As mentioned in detail, since the cooling system of the semiconductor testing device using the control computer comprises the fan for cooling the measuring unit by driving the dc motor, the temperature sensor for measuring the temperature of the measuring unit, and the control computer for reading temperature information and revolution information of the measuring unit and the fan control-power supply unit for controlling the number of revolutions of the fan based on the instruction from the control computer, the number of revolutions of the fan is controlled so as to obtain proper air-flow corresponding to the heating value for every operating mode of the measuring unit, thereby producing an effect of preventing the power used by the fan from being wasted and enabling the supervision of the operating modes of the entire system.

What is claimed is:

1. A cooling system of a semiconductor testing device for cooling a measuring unit of the semiconductor testing devices, comprising:

a rotating fan for cooling the measuring unit and driven by a DC motor;

a temperature sensor for measuring a temperature of the measuring unit which is cooled by the fan; and a control computer connected to the temperature sensor via a temperature supervisory circuit and to the fan via a fan control/power supply unit for reading temperature information of the measuring unit and revolution information of the fan and for outputting a control signal to the fan control/power supply unit for controlling the number of revolutions of the fan, and the fan control/power supply unit executing optimum control of the number of revolutions of the fan based on a heating value for every operating mode of the measuring unit and the control signal supplied from the control computer.

2. The cooling system of a semiconductor testing device according to claim 1, wherein said measuring unit comprises one or not less than two measuring units, said fan comprises one of not less than two fans, said temperature sensor comprises one of not less than two temperature sensors, and said fan control/power supply unit comprises one of not less than two fan control/power supply units.

3. The cooling system of claim 1, wherein the control computer stops the supply of power to the measuring unit when the temperature sensed reaches an anomalous temperature region.

4. The cooling system of a semiconductor testing device according to claim 1, wherein said measuring unit is one of not less than two measuring units, said fan comprises one of not less than two fans, said temperature sensor comprises one of not less than two temperature sensors, and there is provided one said fan control/power supply unit.

5. The cooling system of claim 4, wherein the temperature supervisory circuit comprises a single temperature supervisory circuit for receiving the temperatures for the respective measuring units from the temperature sensors.

6. A cooling system of a semiconductor testing device for cooling a measuring unit of the semiconductor testing device comprising:

a rotating fan for cooling the measuring unit driven by a DC motor;

a temperature sensor for measuring a temperature of the measuring unit which is cooled by the fan;

a control computer connected to the temperature sensor via a temperature supervisory circuit and to the fan via a fan control/power supply unit for reading temperature information of the measuring unit and revolution information of the fan and for outputting a control signal for controlling the number of revolutions of the fan; and the fan control/power supply unit for executing optimum control of the number of revolutions of the fan corresponding to heating value for every operating mode of the measuring unit in response to the control signal supplied from the control computer, said control computer including a decision software for setting a voltage of the DC motor so as to obtain the number of revolutions of the fan needed for cooling the measuring unit corresponding to the heating value when the decision software decides that the temperature of the measuring unit does not reach an anomalous temperature region, and for stopping the supply of power to the measuring unit and setting the voltage of the DC motor so as to rotate the fan at the maximum number of revolutions to cool the measuring unit when the decision software decides that the temperature of the measuring unit reaches the anomalous temperature region.

7. A cooling system for a semiconductor testing device for cooling a measuring unit of the semiconductor testing device comprising:

a fan driven by a motor for cooling the measuring unit;

a temperature sensor for measuring a temperature of the measuring unit which is cooled by the fan; and a control computer connected to the temperature sensor and to the fan for reading temperature information of the measuring unit and revolution information of the fan and for outputting a control signal to a fan control/power supply unit, and the fan control/power supply unit executing optimum control of the number of revolutions of the fan based on a heating value for every operating mode of the measuring unit and the control signal supplied from the control computer, the control computer stopping the supply of power to the measuring unit and rotating the fans at the maximum number of revolutions to cool the measuring unit when the temperature of the measuring unit reaches an anomalous temperature region.

* * * * *